(12) United States Patent
Tsuchiya et al.

(10) Patent No.: US 6,565,309 B1
(45) Date of Patent: May 20, 2003

(54) POLARITY INVERSION APPARATUS AND POLARITY INVERSION METHOD FOR CHIP COMPONENTS

(75) Inventors: Masamichi Tsuchiya, Tokyo-To (JP); Akira Takeoka, Tokyo-To (JP); Masayuki Nishida, Tokyo-To (JP)

(73) Assignee: Tokyo Weld Co., Ltd., Tokyo-To (JP)

(*) Notice: Subject to any disclaimer, the term of this patent is extended or adjusted under 35 U.S.C. 154(b) by 116 days.

(21) Appl. No.: 09/656,167

(22) Filed: Sep. 6, 2000

(30) Foreign Application Priority Data

Sep. 6, 1999 (JP) .......................... 11-251900

(51) Int. Cl.⁷ .......................... B65G 47/248

(52) U.S. Cl. .................. 414/757; 198/376; 198/377.04; 198/377.08; 414/758; 414/765; 414/816

(58) Field of Search ................. 198/373–417; 414/755, 757, 758, 764, 765, 767, 816

(56) References Cited

U.S. PATENT DOCUMENTS 5,044,872 A * 9/1991 Hunt et al. ............. 198/399 X

FOREIGN PATENT DOCUMENTS

JP  2001-72234  * 3/2001

* cited by examiner

Primary Examiner—Janice L. Krizek

(57) ABSTRACT

An object of the present invention is to enable the orientations of chip components accommodated in groove portions of an index table to be assuredly uniformized.

When a polarity judgment device finds that the orientation of the chip component accommodated in the groove portion of the index table is opposite, the polarity inversion apparatus according to the present invention moves the chip component to the component accommodating inversion portion by using compressed air and the intake air from air inlet/outlet ports. Since the bottom surface of the inlet of the inversion portion is set so as to be lower than the base surface under the index table and the width of the inlet of the inversion portion is set so as to be wider than the width of the groove portion, the chip component can move to the inversion portion without getting stuck in the vicinity of the boundary. After rotating the component accommodating inversion portion 180 degrees to change the orientation of the chip component, the compressed air and the intake air from the air inlet/outlet ports are used to return the chip component to the original groove portion. Subsequently, the inversion portion is rotated 180 degrees and the index table is rotated so that the next groove portion is opposed to the inversion portion.

17 Claims, 8 Drawing Sheets

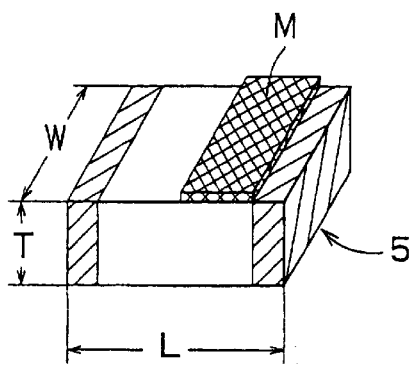
F I G. 1

POLARITY INVERSION APPARATUS AND POLARITY INVERSION METHOD FOR CHIP COMPONENTS

CROSS REFERENCE TO RELATED APPLICATIONS

The subject application is related to subject matter disclosed in Japanese Patent Application No. H11-251900 filed on Sep. 6, 1999 in Japan to which the subject application Claims priority under Paris Convention and which is incorporated herein by reference.

BACKGROUND OF THE INVENTION

1. Field of the Invention

The present invention relates to a polarity inversion apparatus and a polarity inversion method for chip components for uniformizing orientations of chip components accommodated in groove portions of an index table.

2. Related Background Art

There are some chip components having differentiable polarities, e.g., a diode, an electrolytic capacitor, a chip coil (an L chip) and others. In order to recognize a polarity of such a chip component by appearances, a mark M indicative of a polarity such as shown in FIG. 1 is attached to the surface thereof. In the case of taping or classifying such a chip component having a differentiable polarity, the processing for uniformizing polarities is carried out in an index table.

FIG. 2 is a view for illustrating an outline of a conventional polarity inversion apparatus for chip components. A plurality of groove portions 4 having a U-like shape are formed on the outer periphery of a circular index table 3 at predetermined intervals, and an index guide 42 is provided on the external side thereof. Chip components 5 supplied from a chip component supply portion 45 are sequentially accommodated in the groove portions 4 in accordance with rotation of the index table 3.

Further, a polarity judgment device 43 for detecting an orientation of the chip component 5 accommodated in the groove portion 4 and a polarity inversion device 44 for inverting an orientation of the chip component 5 are arranged along the outer periphery of the index table 3.

FIG. 3A is an enlarged top view showing the circumference of the polarity inversion device 44. The polarity inversion device 44 has a chip component accommodating inversion portion 23 formed on the top face of an inversion shaft 6. The chip component accommodating inversion portion 23 performs the operation for inverting an orientation of the chip component accommodated in the groove portion 4 in the opposite direction.

Sensors 14 and 24 for confirming whether the chip component 5 exists are provided above the groove portions 4 and the chip component accommodating inversion portion 23. These sensors irradiate beams to the bottom surface and detect the reflected light from the bottom surface or the chip component 5 to confirm whether the chip component exists.

FIG. 4A shows the state where the chip component 5 is accommodated in the chip component accommodating inversion portion 23. When the inversion shaft 6 is rotated 180 degrees in this state, the orientation of the chip component is inverted as shown in FIG. 4B. Thereafter, the chip component accommodating inversion portion 6 returns the chip component to the original groove portion 4 of the index table 3.

With the above-described procedure, the orientations of all the chip components accommodated in the groove portions 4 of the index table 3 can be uniformized.

FIG. 3B is a cross-sectional view taken along the A—A line in FIG. 3A. As shown in the drawing, the base surface under the index table 3 is substantially flush with the bottom surface of the chip component accommodating inversion portion 23. However, it is difficult to set them strictly flush with each other at the time of assembly adjustment. Further, since there is a form error on the bottom surface of the inversion shaft 6, the chip component 5 may possibly get stuck on the boundary position when the chip component 5 moves from the groove portion 4 to the chip component accommodating inversion portion 23. In such a case, the chip component 5 can not be accommodated in the chip component accommodating inversion portion 23 and the chip component can not be hence normally inverted.

Moreover, although the width of the groove portion 4 must be matched with that of the chip component accommodating inversion portion 23 in order to move the chip component from the groove portion 4 to the chip component accommodating inversion portion 23, the chip component may possibly get stuck on the boundary position of the groove portion 4 and each side wall portion of the chip component accommodating inversion portion 23 because of the stop accuracy of the index table 3 and the form error.

SUMMARY OF THE INVENTION

In view of the above-described drawbacks, an object of the present invention is to provide a polarity inversion apparatus and a polarity inversion method for chip components being capable of assuredly uniformizing orientations of chip components accommodated in groove portions in an index table.

To achieve this aim, the present invention provides a polarity inversion apparatus comprising:

an index table having groove portions which are capable of accommodating chip components therein, said groove portions being provided to external periphery of said index table; and a chip component inversion portion which takes out said chip component accommodated in said groove portion to invert the orientation of said chip component and thereafter accommodates it in said original groove portion, wherein said chip component inversion portion has a rotatable inversion shaft; and a chip component accommodating inversion portion provided above said inversion shaft;

said chip component accommodating inversion portion has an inlet which is arranged on one side of said chip component accommodating inversion portion and receives said chip component from said groove portion; and an outlet which is arranged on the other side of said chip component accommodating inversion portion and sends said inverted chip component into said groove portion; and the height of the bottom surface of said inlet of said chip component accommodating inversion portion is set so as to be lower than the height of the bottom surface of said groove portion.

According to the present invention, when moving the chip component from the groove portion of the index table to the chip component accommodating inversion portion, since the chip component does not get stuck in the vicinity of the boundary between the groove portion and the chip component accommodating inversion portion, the chip component can assuredly move to the chip component accommodating inversion portion, thereby reliably uniformizing the orientations of the chip components in the groove portions.

Further, according to the present invention, since the height of the bottom surface of the inlet of the chip component accommodating inversion portion is set so as to be lower than the height of the bottom surface of the groove portion, the chip component does not get stuck on the boundary position between the groove portion and the chip component accommodating inversion portion.

Furthermore, according to the present invention, the width of the inlet for the chip component accommodating inversion portion is wider than that of the groove portion, and the width of the outlet for the chip component accommodating inversion portion is narrower than that of the groove portion, thereby smoothly moving the chip component from the groove portion to the chip component accommodating inversion portion.

Moreover, according to the present invention, since the chip component is moved by air blow-off and suction, the chip component can be assuredly moved with a simple structure.

In addition, according to the present invention, since existence confirming means for confirming existence/absence of the chip component is provided, the chip component can be automatically inverted.

Also, according to the present invention, after returning the chip component to the original groove portion, the chip component accommodating inversion portion is rotated 180 degrees, and the groove portion can be securely opposed to the inlet of the chip component accommodating inversion portion.

BRIEF DESCRIPTION OF THE DRAWINGS

FIG. 1 is a perspective view of a chip component;

FIG. 3A is an enlarged top plan view of a circumference of the polarity inversion apparatus while FIG. 3B is a cross-sectional view taken along the A—A line of FIG. 3A;

FIG. 4A is a view showing the state where a chip component is accommodated in a chip component accommodating inversion portion while

FIG. 5A is a top plan view of a primary part of a polarity inversion apparatus for a chip component according to the present invention while FIG. 5B is a cross-sectional view taken along the A—A line in FIG. 5A;

FIG. 7A is a cross-sectional view taken along the A—A line in FIG. 6 while FIG. 7B is a cross-sectional view taken along the B—B line in FIG. 6;

FIG. 8A is an enlarged cross-sectional view taken along the dotted line p1 in FIG. 7A while

DESCRIPTION OF THE PREFERRED EMBODIMENTS

A polarity inversion apparatus for chip components according to the present invention will now be concretely described hereunder with reference to the accompanying drawings. Description will be given hereinafter with taking a polarity inversion apparatus for a chip component with a polarity, e.g., an L chip having a dimension of 1.1 mm×0.6 mm×0.39 mm as an example.

Figures 5A, 5B:
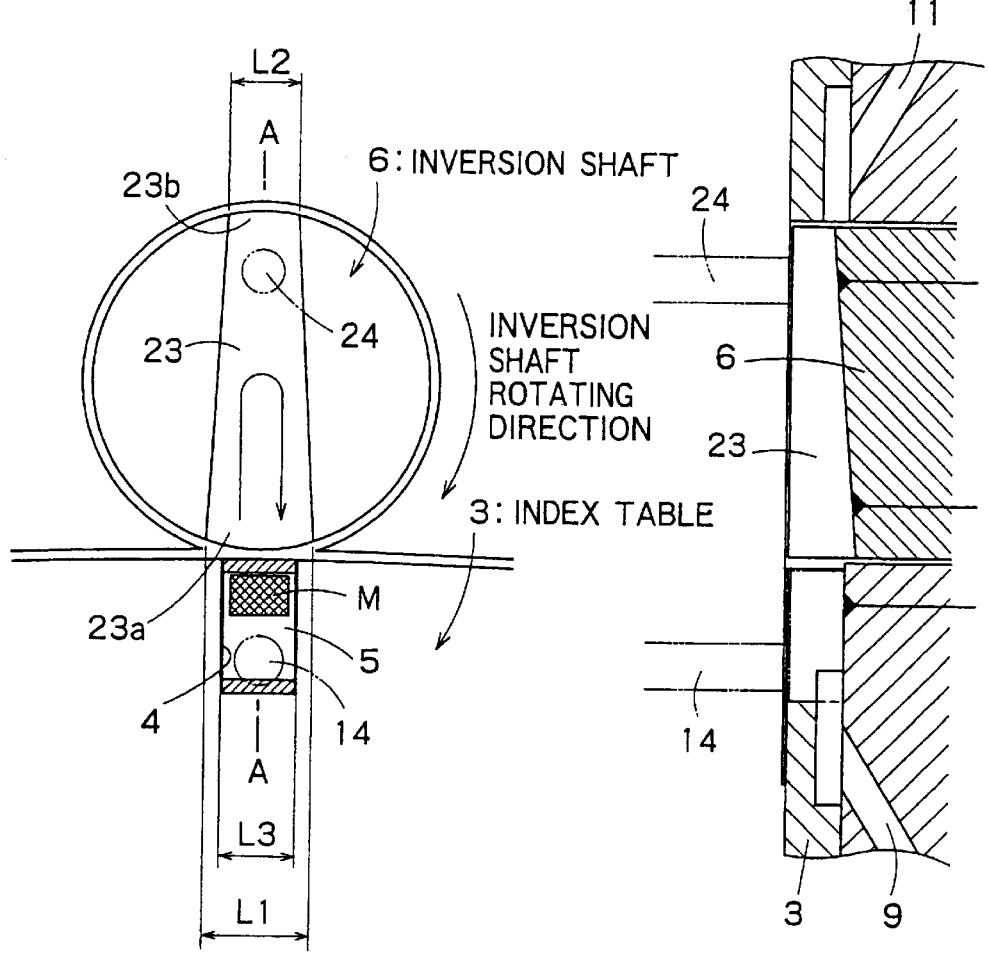
Figure 6:
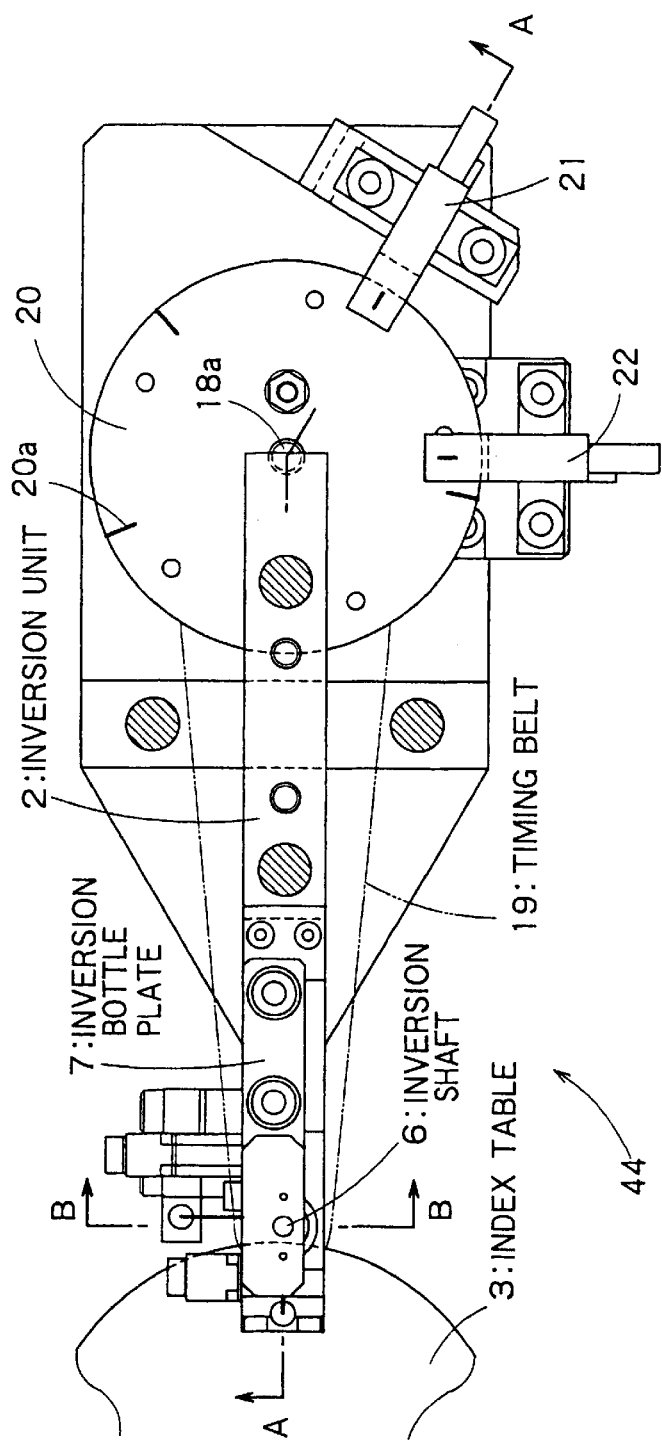
FIG. 6 is a top plan view of the polarity inversion apparatus.
Figures 7A, 7B:
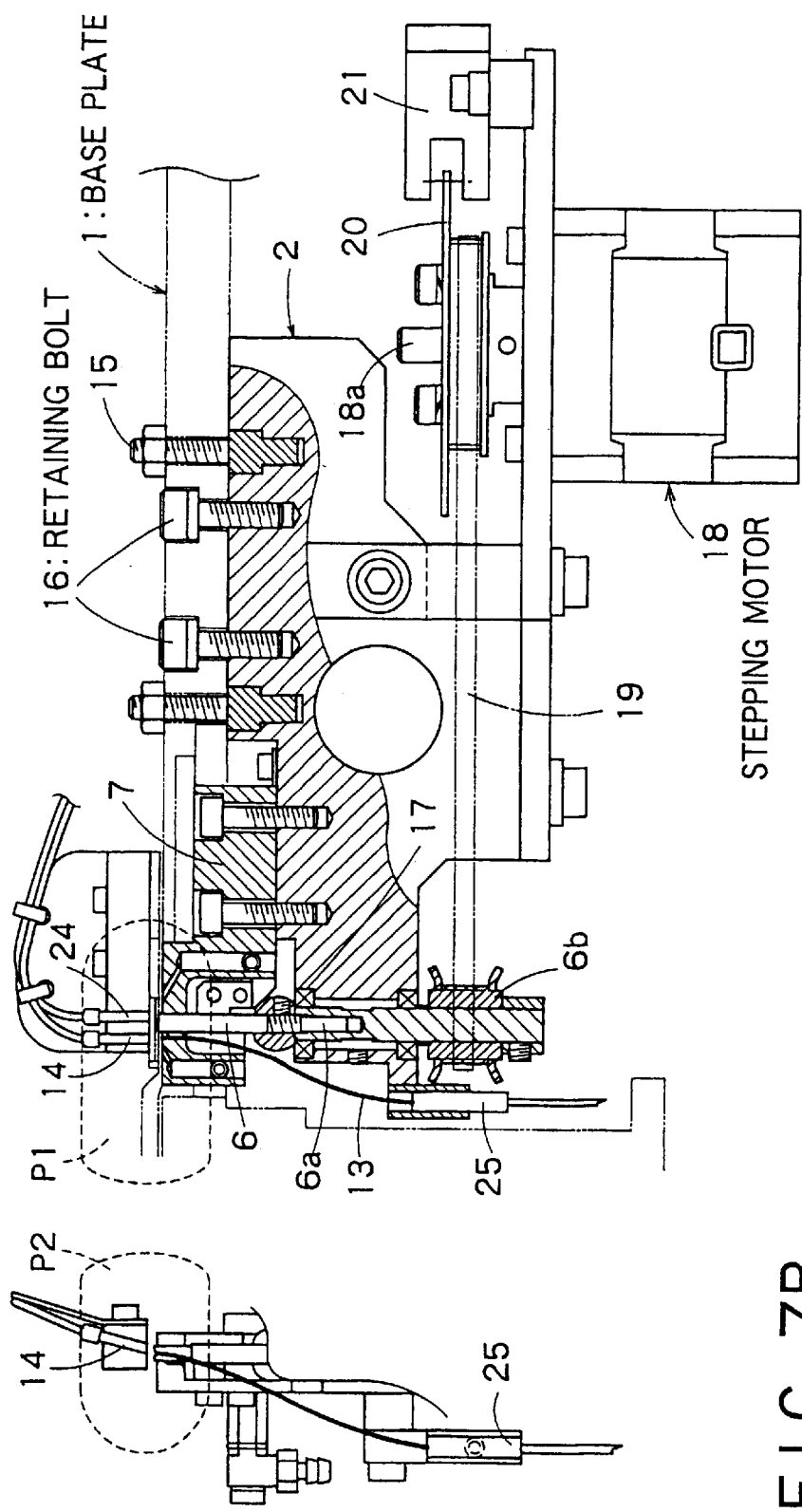
Figure 8A:
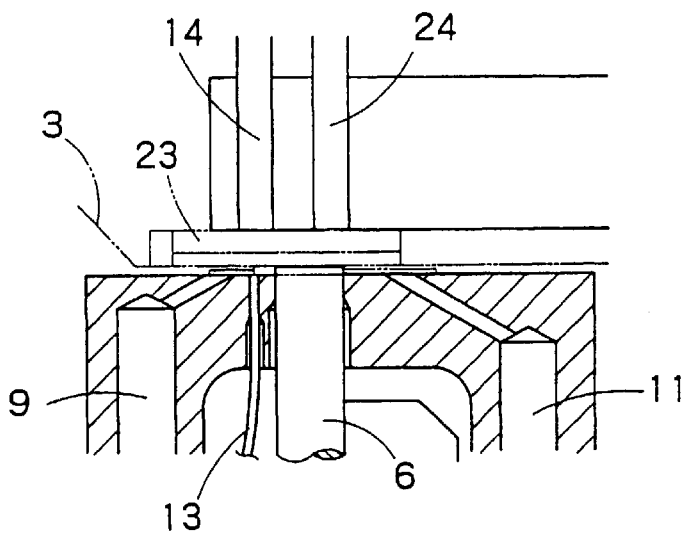
Figure 8B:
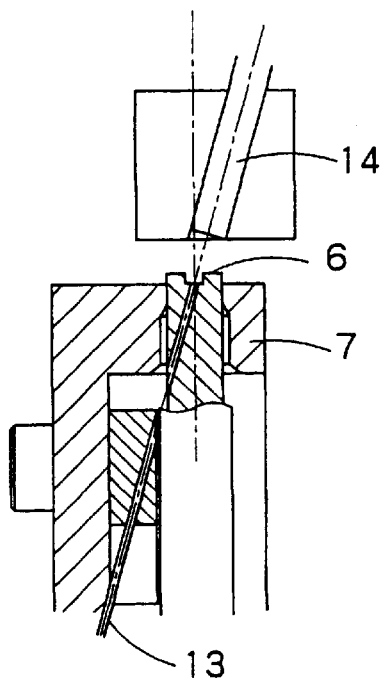
FIG. 8B is an enlarged cross-sectional view taken along the dotted line p2 in FIG. 7B.

FIG. 5A is a top plan view showing a primary part of the polarity inversion apparatus, for a chip component according to the present invention, and FIG. 5B is a cross-sectional view taken along the A—A line in FIG. 5A. FIG. 6 is a top plan view of the polarity inversion apparatus 44, FIG. 7A is a cross-sectional view taken along the A—A line in FIG. 6, and FIG. 7B is a cross-sectional view taken along the B—B line in FIG. 6. Further, FIG. 8A is an enlarged cross-sectional view taken along the dotted line p1 in FIG. 7A, and FIG. 8B is an enlarged cross-sectional view of the dotted line p2 in FIG. 7B.

The overall structure of the polarity inversion apparatus 44 according to the present invention will now be described with reference to FIGS. 6 to 8. The polarity inversion apparatus 44 in FIG. 6 includes an inversion unit 2 set under a base plate 1. To the inversion unit 2 are attached an inversion shaft (chip component inverting means) 6 for inverting the direction of a chip component 5 accommodated in a groove portion 4 of an index table 3 and an inversion bottom plate 7.

Figure 9A:
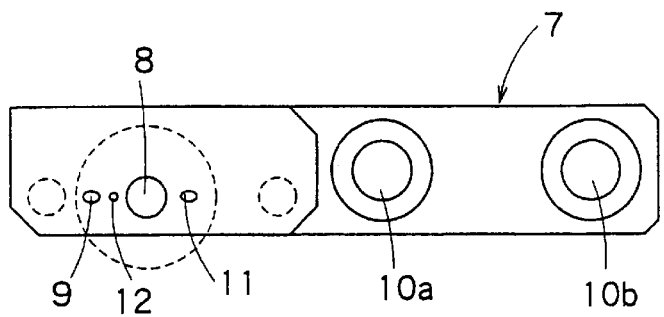
FIGS. 9A–C are views showing the structure of an inversion bottom plate.
Figure 9B:
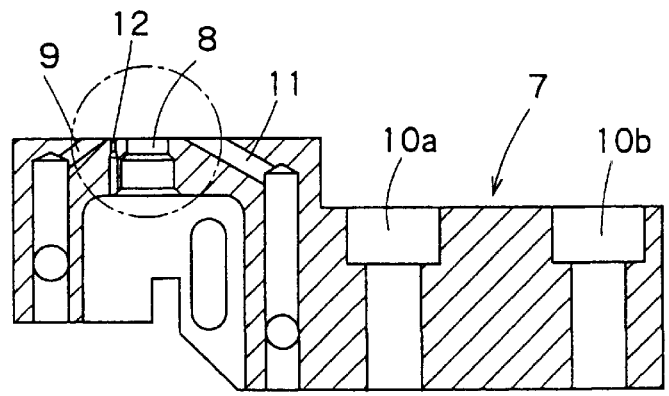
Figure 9C:
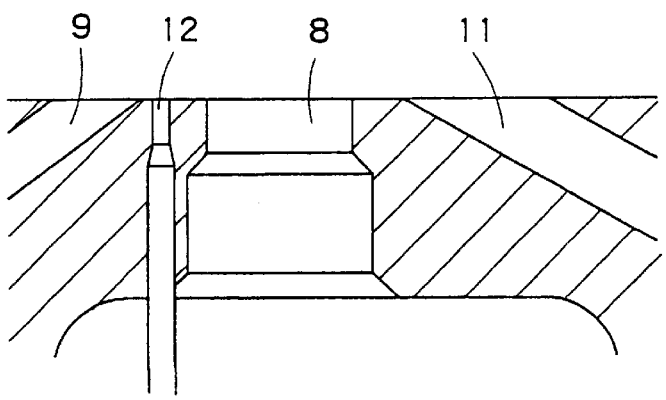

FIG. 9B is a view showing a cross-sectional structure of the inversion bottom plate 7. The top face of the inversion bottom plate 7 forms a step. On the higher surface of the step, a hole 8 into which the inversion shaft 6 is inserted, air inlet/outlet ports (first and second air inlet/outlet ports) 9 and 11 for pushing out the chip component 5, a hole 12 for confirming the existence of the chip component 5, and holes 10a and 10b for bolts fixing the inversion bottom plate 7 to the inversion unit 2 are formed. As shown in FIGS. 7 and 8, an optic fiber 13 is inserted into the hole 12, and an existence confirmation sensor (existence confirming means) 14 for detecting existence/absence of the chip component 5 is set above the optic fiber 13.

As shown in FIG. 7A, since the inversion bottom plate 7 is formed of a member different from the inversion unit 2, it is possible to adjust the heights of the inversion shaft 6 and the inversion bottom plate 7 at the time of assemble adjustment with the inversion unit 2 being removed.

As shown in FIG. 7A, the height adjustment of the inversion bottom plate 7 and the base plate 1 at the time of attachment of the inversion unit 2 is conducted by using a push bolt 15 and a retaining bolt 16 attached to the base plate 1.

A screw 6a is run out below the inversion shaft 6 as shown in FIG. 7A, and the height of the inversion shaft 6 is adjusted in accordance with a penetration amount of the screw 6a. After the height adjustment, fastening a set bolt 17 causes the inversion shaft 6 to be fixed to the inversion unit 2.

A stepping motor 18 is set below the inversion unit 2, and a space between a rotating shaft 18a of the motor 18 and a bearing 6b of the inversion shaft 6 is spanned with a timing belt 19. The turning force of the stepping motor 18 is transmitted to the inversion shaft 6 through the timing belt 19.

A circular plate 20 having a plurality of slits 20a formed thereto is attached to the rotating shaft 18a of the stepping motor 18, and optical transmission type sensors 21 and 22 are arranged so as to sandwich the circular plate 20. The sensors 21 and 22 detect an amount of rotation of the stepping motor 18 by detecting passage of the slits 20a.

Figures 3A, 3B:
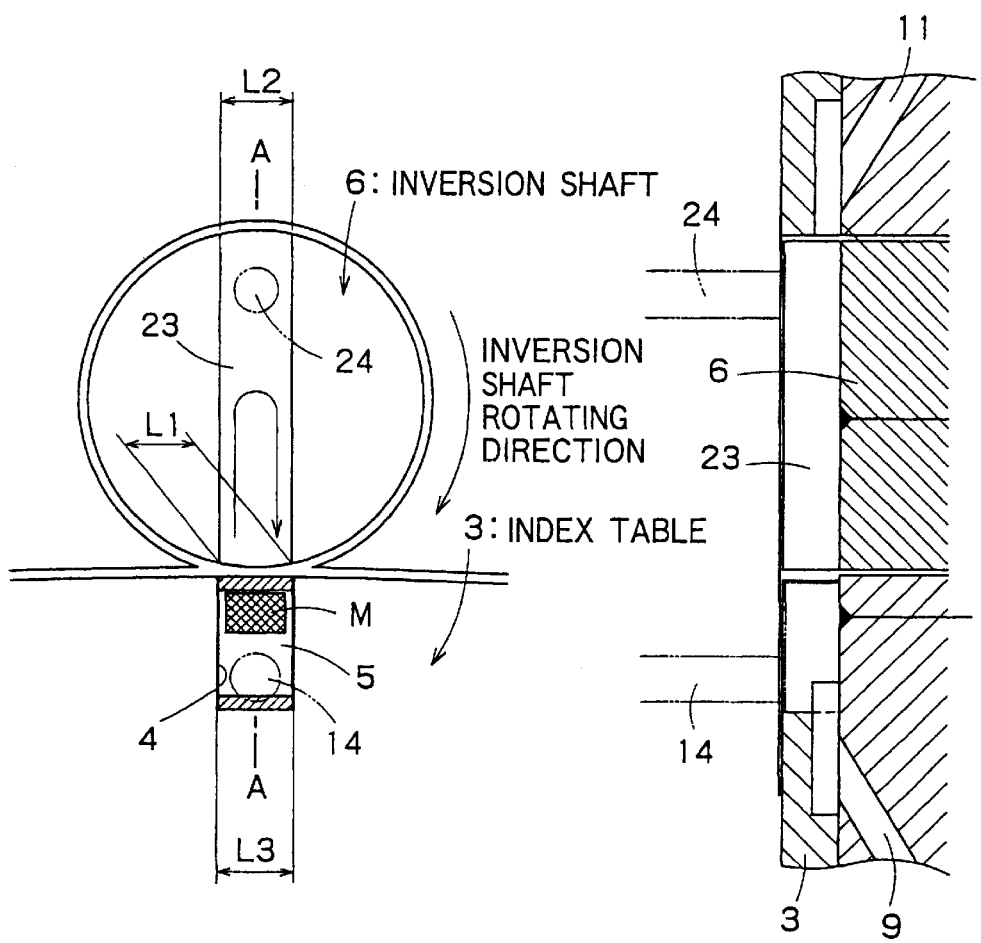
Figure 4A:
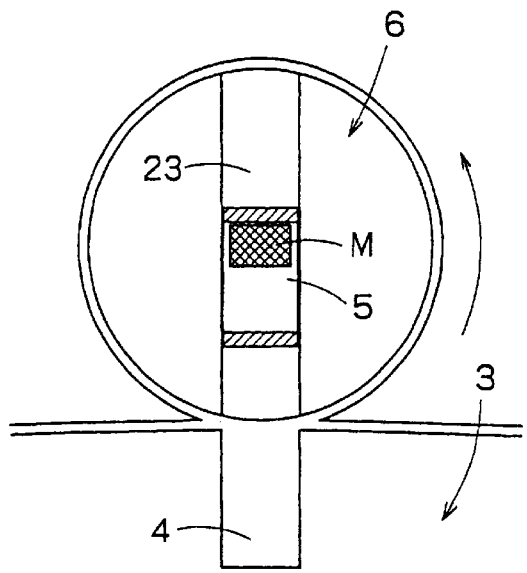
Figure 4B:
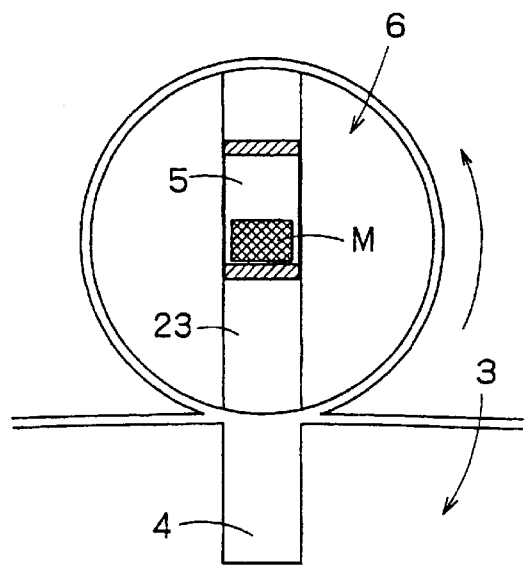
FIG. 4B is a view showing the state where the chip component is inverted.

As shown in FIG. 5A, a chip component accommodating inversion portion 23 is formed on the top surface of the inversion shaft 6. As different from FIG. 3A, the chip component accommodating inversion portion 23 separately includes an insertion port 23a and an ejection port 23b for the chip component 5, and the width L1 of the insertion port 23a is wider than the width L2 of the ejection port 23b. There is the relationship of L1>L3>L2 between the widths L1 and L2, and the width L3 of the groove portion 4.

Additionally, as shown in FIG. 5B, an inclination is formed on the bottom surface of the chip component accommodating inversion portion 23, and the bottom surface of the insertion port 23a is set so as to be lower than the base surface under the index table 3 while the bottom surface of the ejection port 23b is set so as to be slightly higher than the base surface under the index table 3.

As an example, when the width L3 of the groove portion 4 of the index table 3 is 0.7 mm, the width L1 of the insertion port 23a is set to 0.95 mm and the width L2 of the ejection port is set to 0.68 mm. In addition, the bottom surface of the insertion port 23a is set so as to be lower than the base surface of the index table 3 by 0.02 mm and the bottom surface of the ejection port 23b is set so as to be higher than the same by 0.02 mm.

As a result, when pushing out the chip component 5 from the groove portion 4 of the index table 3 to the chip component accommodating inversion portion 23, there occurs no inconvenience such that the chip component 5 gets stuck on the boundary position.

A seat confirmation sensor 14 for detecting whether the chip component 5 exists in the groove portion 4 is set above the groove portion 4 of the index table 3. Similarly, a seat confirmation sensor 24 for detecting existence/absence of the chip component 5 is set above the chip component accommodating inversion portion 23.

An optic fiber 13 is arranged below the seat confirmation sensors 14 and 24, respectively, and a sensor for transmitting the light through the optic fiber 13 is integrally attached at one end of the optic fiber 13. The seat confirmation sensors 14 and 24 detect existence/absence of the chip component based on whether the light from the sensors is shut out by the chip component 5.

Air inlet/outlet ports 9 and 11 for moving the chip component 5 are provided to the groove portion 4 of the index table 3 and the chip component accommodating inversion portion 23 for the inversion shaft 6, respectively. When moving the chip component 5 from the groove portion 4 to the chip component accommodating inversion portion 23, the compressed air is blown from the air inlet/outlet port 9 to the chip component 5, and the air is sucked at the air inlet/outlet port 11. On the contrary, when moving the chip component 5 from the chip component accommodating inversion portion 23 to the groove portion 4, the compressed air is blown from the air inlet/outlet port 11 to the chip component 5, and the air is sucked at the air inlet/outlet port 9.

Figure 2:
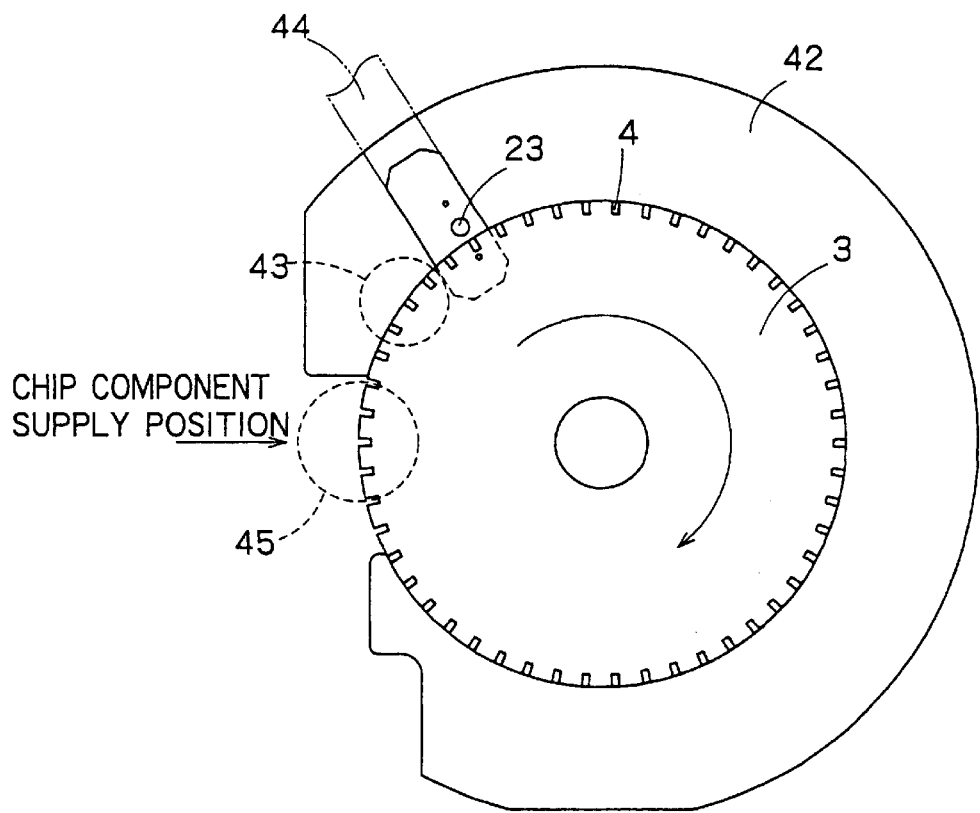
FIG. 2 is a view for explaining an outline of a conventional polarity inversion apparatus for a chip component.

The operation of the polarity inversion apparatus 44 according to this embodiment will now be described. As shown in FIG. 2, the chip components 5 are sequentially accommodated in the groove portions 4 from the chip component supply portion 45 while rotating the index table 3. Further, at the same time, a polarity judgment device 43 is used to detect the direction of the chip component housed in the groove portion 4. It is to be noted that the polarity judgment device 43 reads a mark M of the chip component 5 to determine the direction by using a camera, a sensor and others.

When it is found that the orientation of the chip component 5 is opposite, the compressed air is blown from the air inlet/outlet port 9 to the chip component 5, and the air is sucked from the air inlet/outlet port 11 to move the chip component 5 to the chip component accommodating inversion portion 23. At this time, as shown in FIG. 5B, since the position of the bottom surface of the chip component accommodating inversion portion 23 in the vicinity of the inlet port for the chip component accommodating inversion portion 23 is lower than a position of the base surface under the index table 3, the chip component 5 can be smoothly moved to the chip component accommodating inversion portion 23 without getting stuck on the boundary position.

When the seat confirmation sensor 24 finds that the chip component 5 was sent to the chip component accommodating inversion portion 23, the inversion shaft 6 is rotated 180 degrees to invert the orientation of the chip component 5.

Subsequently, the compressed air is blown from the air inlet/outlet port 11 to the chip component 5 and, at the same time, the air is sucked from the air inlet/outlet port 9 so that the chip component 5 is pushed out from the outlet port 23b of the chip component accommodating inversion portion 23 to be accommodated in the original groove portion 4.

When the seat confirmation sensor 14 finds that the chip component 5 is accommodated in the groove portion 4, the inversion shaft 6 is rotated 180 degrees. At the same time, the index table 3 is rotated to cause the next groove portion 4 to be opposed to the inlet of the chip component accommodating inversion portion 23. It is to be noted that confirmation on whether the inlet 23a of the chip component accommodating inversion portion 23 is caused to be opposed to the groove portion 4 is carried out by using the seat confirmation sensor 24.

As described above, in the present embodiment, since the bottom surface in the vicinity of the inlet of the chip component accommodating inversion portion 23 is lower than the base surface under the index table 3 and the width in the vicinity of the inlet of the chip component accommodating inversion portion 23 is wider than the width of the groove portion 4, the chip component 5 can not get stuck on the boundary position when pushing out the chip component 5 from the groove portion 4 to the chip component accommodating inversion portion 23. Therefore, the chip component 5 can be assuredly pushed out to the chip component accommodating inversion portion 23 to be inverted, and the orientations of all the chip components 5 in the groove portions 4 of the index table can be uniformized.

Also, in the case of returning the chip component from the chip component accommodating inversion portion 23 to the groove portion 4, the base surface under the index table 3 is lower than the bottom surface in the vicinity of the outlet of the chip component accommodating inversion portion 23 and the width of the groove portion 4 is wider than that of the chip component accommodating inversion portion 23. Therefore, the chip component 5 can be securely accommodated in the groove portion 4 without getting stuck on the boundary position.

In the above-described embodiment, although description has been given as to the case where the bottom surface in the vicinity of the inlet 23a of the chip component accommodating inversion portion 23 is lower than the base surface under the index table 3 and the width in the vicinity of the inlet 23a of the chip component accommodating inversion portion 23 is wider than that of the groove portion 4, both widths may be set so as to be equal to each other. That is because the chip component 5 does not get stuck on the boundary position if the bottom surface in the vicinity of the inlet 23a is lower than the base surface under the index table 3.

In addition, the width in the vicinity of the outlet 23b of the chip component accommodating inversion portion 23 may be equal to the width of the groove portion 4. Similarly, the bottom surface in the vicinity of the outlet 23b may be set at the height equal to that of the base surface under the index table 3.

In the foregoing embodiment, although the example where the chip component accommodating inversion portion 23 is formed on the upper surface of the inversion shaft 6 is explained, another member may be used for structure. Additionally, the chip component accommodating inversion portion 23 is not restricted to any specific size.

What is claimed is:

1. A polarity inversion apparatus comprising:
    an index table having groove portions which are capable of accommodating chip components therein, said groove portions being provided on the external periphery of said index table; and a chip component inversion portion which receives said chip component from said groove portion to invert the orientation of said chip component and thereafter transfers the inverted chip component to an original groove portion,
    wherein said chip component inversion portion has a rotatable inversion shaft; and a chip component accommodating inversion portion provided above said inversion shaft;
    said chip component accommodating inversion portion has an inlet which is arranged on one side of said chip component accommodating inversion portion and receives said chip component from said groove portion; and an outlet which is arranged on the other side of said chip component accommodating inversion portion and sends said inverted chip component into said groove portion; and
    the height of the bottom surface of said inlet of said chip component accommodating inversion portion is set so as to be lower than the height of the bottom surface of said groove portion.

2. The polarity inversion apparatus according to claim 1, wherein the width of said inlet of said chip component accommodating inversion portion is set so as to be equal to or wider than the width of said groove portion and the width of said outlet of said chip component accommodating inversion portion is set so as to be equal to or narrower than the width of said groove portion.

3. The polarity inversion apparatus according to claim 2, wherein said bottom surface of said chip component accommodating inversion portion continuously rises from said inlet to said outlet and the width of said chip component accommodating inversion portion continuously narrows from said inlet to said outlet.

4. The polarity inversion apparatus according to claim 3, wherein said bottom surface of said inlet of said chip component accommodating inversion portion is set so as to be lower than a base surface of said index table, and said bottom surface of said outlet of said chip component accommodating inversion portion is set so as to be higher than the base surface of said index table.

5. The polarity inversion apparatus according to claim 4, further comprising height adjusting means for adjusting the height of said inversion shaft in accordance with a penetration amount of a screw portion formed under said inversion shaft.

6. The polarity inversion apparatus according to claim 1, wherein a first air inlet/outlet port for moving said chip component is formed in said groove portion of said index table;
    a second air inlet/outlet port for moving said chip component is formed in said chip component inversion portion; and
    in the case of moving said chip component accommodated in said groove portion to said chip component accommodating inversion portion, air is blown from said first air inlet/outlet port to said chip component and air is sucked from said second air inlet/outlet port, and in the case of moving said chip component from said chip component accommodating inversion portion to said groove portion, air is blown from said second air inlet/outlet port to said chip component and air is sucked from said first air inlet/outlet port.

7. The polarity inversion apparatus according to claim 1, further comprising existence confirming means for detecting whether said chip component exists in said chip component accommodating inversion portion,
    wherein, when it is found that the orientation of said chip component accommodated in said groove portion is opposite, said chip component inversion portion moves said chip component from said groove portion to said chip component accommodating inversion portion and, upon confirming the existence of said chip component by said existence confirming means, said chip component inversion portion inverts said chip component and then returns said chip to an original groove portion.

8. The polarity inversion apparatus according to claim 7, wherein after returning said chip component from said chip component accommodating inversion portion to said groove portion, said chip component inversion portion inverts said chip component accommodating inversion portion 180 degrees so that said inlet of said chip component accommodating inversion portion is opposed to said groove portion.

9. The polarity inversion apparatus according to claim 1, further comprising:
    an inversion bottom plate having said chip component inversion portion and said chip component accommodating inversion portion;
    an inversion unit fixed to said inversion bottom plate;
    a stepping motor attached under said inversion unit; and
    a timing belt taken over a span between said stepping motor and a bearing of said inversion shaft.

10. A polarity inversion method for moving a chip component accommodated in a groove portion provided on an external periphery of an index table to a chip component accommodating inversion portion provided on an upper portion of a rotatable inversion shaft to invert the orientation of said chip component comprising the steps of rotating said rotatable inversion shaft, and thereafter transferring said chip component into an original groove portion,
    wherein said chip component accommodating inversion portion has an inlet for receiving said chip component from said groove portion; and an outlet for sending said inverted chip component to said original groove portion,
    the height of the bottom surface of said inlet of said chip component accommodating inversion portion being set so as to be lower than the height of the bottom surface of said groove portion.

11. The polarity inversion method for a chip component according to claim 10, wherein the width of said inlet of said chip component accommodating inversion portion is set so as to be equal to or wider than the width of said groove portion and the width of an outlet of said chip component accommodating inversion portion is set so as to be equal to or narrower than the width of said groove portion.

12. The polarity inversion method according to claim 11, wherein the bottom surface of said chip component accommodating inversion portion continuously rises from said inlet to said outlet and the width of said chip component accommodating inversion portion continuously narrows from said inlet to said outlet.

13. The polarity inversion method according to claim 12, wherein said bottom surface of said inlet of said chip component accommodating inversion portion is set so as to be lower than a base surface of said index table, and said bottom surface of said outlet of said chip component accommodating inversion portion is set so as to be higher than said base surface of said index table.

14. The polarity inversion method according to claim 13, including the steps of adjusting the height of said inversion shaft in accordance with a penetration amount of a screw portion formed under said inversion shaft.

15. The polarity inversion method according to claim 10, wherein a first air inlet/outlet port for moving said chip component is formed in said groove portion of said index table;

a second air inlet/outlet port for moving said chip component is formed in said chip component inversion portion; and in the case of moving said chip component accommodated in said groove portion to said chip component accommodating inversion portion, blowing air from said first inlet/outlet port and sucking air from said second air inlet/outlet port, and in the case of moving said chip component from said chip component accommodating inversion portion to said groove portion, blowing air from said second air inlet/outlet port to said chip component and sucking air from said first air inlet/outlet port.

16. The polarity inversion method according to claim 10, wherein when it is found that the orientation of said chip component accommodated in said groove portion is opposite, moving said chip component from said groove portion to said chip component accommodating inversion portion and, upon confirming that said chip component exists in said chip component accommodating inversion portion, inverting said chip component to be then returned to said original groove portion.

17. The polarity inversion method according to claim 10, wherein after returning said chip component from said chip component accommodating inversion portion to said groove portion, said chip component accommodating inversion portion is inverted 180 degrees so that said inlet of said chip component accommodating inversion portion is opposed to said groove portion.

* * * * *